United States Patent
Beasor et al.

(10) Patent No.: US 9,330,971 B2
(45) Date of Patent: May 3, 2016

(54) METHOD FOR FABRICATING INTEGRATED CIRCUITS INCLUDING CONTACTS FOR METAL RESISTORS

(71) Applicant: GLOBALFOUNDRIES, Inc., Grand Cayman (KY)

(72) Inventors: Scott Beasor, Greenwich, NY (US); Jagar Singh, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/195,932

(22) Filed: Mar. 4, 2014

(65) Prior Publication Data

US 2015/0255335 A1 Sep. 10, 2015

(51) Int. Cl.
*H01L 21/768* (2006.01)
*H01L 23/48* (2006.01)
*H01L 23/50* (2006.01)
*H01L 27/06* (2006.01)
*H01L 21/8234* (2006.01)

(52) U.S. Cl.
CPC .... *H01L 21/76877* (2013.01); *H01L 21/76802* (2013.01); *H01L 23/481* (2013.01); *H01L 23/50* (2013.01); *H01L 21/823431* (2013.01); *H01L 21/823475* (2013.01); *H01L 27/0629* (2013.01)

(58) Field of Classification Search
None
See application file for complete search history.

(56) References Cited

U.S. PATENT DOCUMENTS

| 6,121,129 A * | 9/2000 | Greco et al. | 438/622 |
| 6,204,692 B1 * | 3/2001 | Nakagawa | 326/83 |
| 2014/0264588 A1 * | 9/2014 | Chen et al. | 257/343 |
| 2014/0264750 A1 * | 9/2014 | Chang et al. | 257/533 |

OTHER PUBLICATIONS

The Free Dictionary Online. Word definition of "adjacent."*
The Free Dictionary Online. Word definition of "optionally."*

* cited by examiner

*Primary Examiner* — Yu-Hsi D Sun
*Assistant Examiner* — Mikka Liu
(74) *Attorney, Agent, or Firm* — Ingrassia Fisher & Lorenz, P.C.

(57) ABSTRACT

Integrated circuits and methods for fabricating integrated circuits are provided. In one example, a method for fabricating an integrated circuit includes etching an ILD layer of dielectric material overlying a semiconductor substrate that includes a device region to form first contact vias that expose active areas of the device region. The ILD layer is etched to form second contact vias that correspondingly expose a gate that is disposed in the device region and a patterned resistive metal-containing layer that is disposed in the ILD layer adjacent to the device region. The first contact vias and the second contact vias are filled with an electrically-conductive material to form first contacts that are in electrical communication with the active areas and second contacts that include a gate contact and a metal resistor contact that are in electrical communication with the gate and the patterned resistive metal-containing layer, respectively.

19 Claims, 6 Drawing Sheets

METHOD FOR FABRICATING INTEGRATED CIRCUITS INCLUDING CONTACTS FOR METAL RESISTORS

TECHNICAL FIELD

The technical field relates generally to integrated circuits and methods for fabricating integrated circuits, and more particularly relates to integrated circuits with reliable electrical connections to metal resistors and methods for fabricating such integrated circuits.

BACKGROUND

Integrated circuits (ICs) have been pivotal to accelerating progress in electronic device performance, enabling device sizes to shrink without sacrificing performance. ICs have been widely adopted for electronic devices, as opposed to designs using discrete transistors, due to various capabilities that are enabled by the ICs. For example, ICs can be readily mass produced, generally exhibit excellent reliability, and enable a building-block approach to circuit design.

ICs generally include a semiconductor substrate including a device, such as an interconnected field effect transistor (FET), disposed thereon and therein defining a device region. A FET includes a gate electrode structure as a control electrode and spaced apart active areas, e.g., source and drain electrodes, between which a current can flow. A control voltage applied to the gate electrode structure controls the flow of current through a channel region between the source and drain electrodes. Typically, modern ICs contain millions of such transistors.

Layers of dielectric materials are formed over the semiconductor substrate including over the device region(s). The ICs may include additional devices such as metal resistors that are embedded in the dielectric materials above the semiconductor substrate. During fabrication of the ICs, electrical connections to the transistors and metal resistors or other additional devices that are embedded in the IC are generally formed for purposes of completing electrical routing in the circuit. The electrical connections between the devices in the IC are formed in the layers of dielectric materials through known techniques of selectively etching through the layers to form vias that uncover contact surfaces of the devices, followed by filling the vias with an electrically-conductive material to form the electrical connections. Often, configurations of the transistors and the metal resistors are such that direct paths through the layers of dielectric materials for via formation are at different levels within the IC. While it would be desirable to minimize fabrication steps by efficiently forming vias simultaneously to the various contact surfaces of the transistors and metal resistors, these devices are usually at different levels and the contact surfaces that are to be uncovered by the respective vias correspondingly lie on different, parallel planes within the IC. Because etchings generally proceed at constant rates for via formation, "via punch-through" often occurs at shallower contact surfaces, especially when the shallower contact surface includes a metal resistor surface that is typically formed of a thin resistive metal-containing layer. "Via punch-through" refers to propagation of the via completely through the thin resistive metal-containing layer. Via punch-through results in ineffective electrical connection upon subsequent filling of the vias with electrically-conductive material, and may compromise the integrity of the IC by etching through the layers that are not intended to be etched.

Accordingly, it is desirable to provide integrated circuits and methods of forming integrated circuits that enable relatively efficient formation of electrical connections to transistors and metal resistors within the integrated circuit while avoiding via punch-through. Furthermore, other desirable features and characteristics of the present invention will become apparent from the subsequent detailed description and the appended claims, taken in conjunction with the accompanying drawings and this background.

BRIEF SUMMARY

Integrated circuits and methods for fabricating integrated circuits are provided herein. In accordance with an exemplary embodiment, a method for fabricating an integrated circuit includes etching an ILD layer of dielectric material overlying a semiconductor substrate that includes a device region to form first contact vias that expose active areas of the device region. The ILD layer is etched to form second contact vias that correspondingly expose a gate that is disposed in the device region adjacent to the active areas and a patterned resistive metal-containing layer that is disposed in the ILD layer adjacent to the device region. The first contact vias and the second contact vias are filled with an electrically-conductive material to form first contacts that are in electrical communication with the active areas and second contacts that include a gate contact and a metal resistor contact. The gate contact is in electrical communication with the gate and the metal resistor contact is in electrical communication with the patterned resistive metal-containing layer.

In accordance with another exemplary embodiment, a method for fabricating an integrated circuit is provided. The method includes patterning a resistive metal-containing layer overlying a first dielectric material layer to form a patterned resistive metal-containing layer. The first dielectric material layer overlies a semiconductor substrate that includes a device region and the patterned resistive metal-containing layer is disposed laterally adjacent to the device region overlying the first dielectric material layer and the semiconductor substrate. A second dielectric material layer is deposited overlying the first dielectric material layer and the patterned resistive metal-containing layer. The first and second dielectric material layers are etched to form first contact vias that expose active areas of the device region. The second dielectric material layer and optionally an upper portion of the first dielectric material layer are etched to form second contact vias that correspondingly expose the patterned resistive metal-containing layer and a gate that is disposed in the device region adjacent to the active areas. An electrically-conductive material is deposited in the first contact vias and the second contact vias to form first contacts that are in electrical communication with the active areas and second contacts that include a gate contact and a metal resistor contact. The gate contact is in electrical communication with the gate and the metal resistor contact is in electrical communication with the patterned resistive metal-containing layer.

In accordance with another exemplary embodiment, an integrated circuit is provided. The integrated circuit includes a semiconductor substrate. The semiconductor substrate includes a device region with active areas. A gate is disposed in the device region adjacent to the active areas. An ILD layer of dielectric material overlies the semiconductor substrate. A patterned resistive metal-containing layer is disposed in the ILD layer adjacent to the device region. First contacts are formed through the ILD layer and are in electrical communication with the active areas. Second contacts are formed partially through the ILD layer and include a gate contact and a metal resistor contact. The gate contact is in electrical communication with the gate and the metal resistor contact is in electrical communication with the patterned resistive metal-containing layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
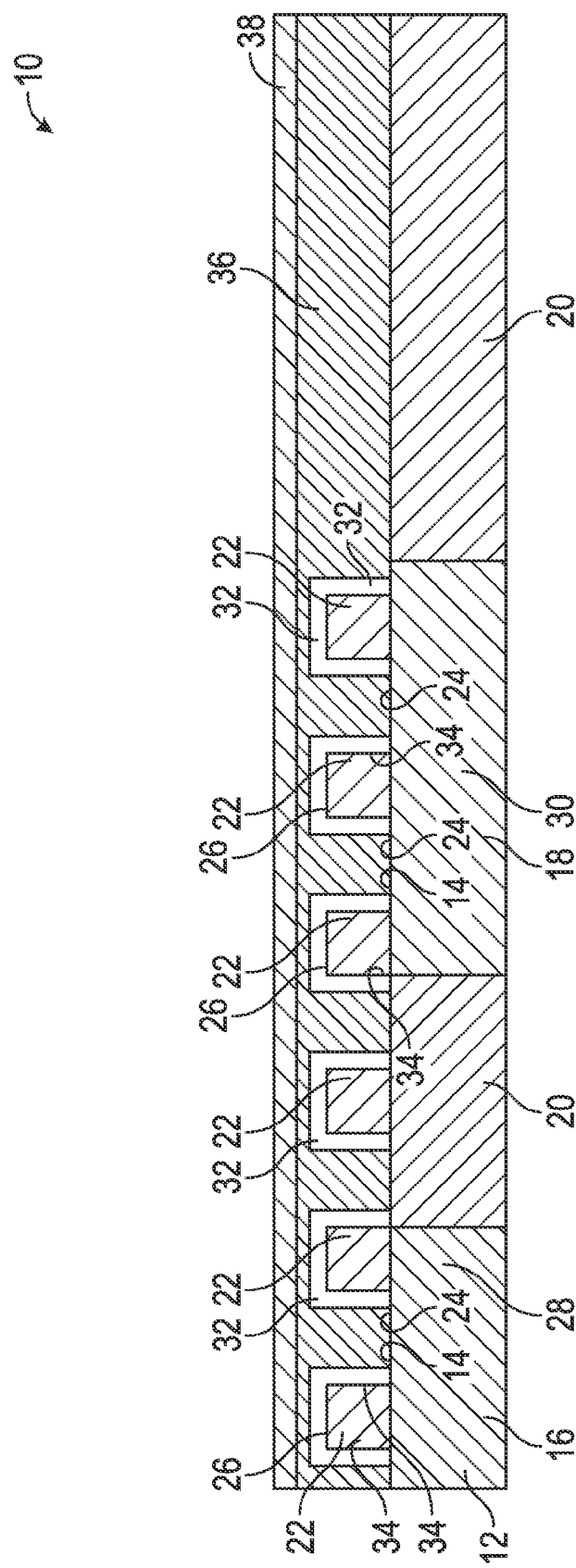
FIGS. 1-6 illustrate, in cross-sectional views, an integrated circuit and a method for fabricating an integrated circuit during various intermediate fabrication stages in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to integrated circuits and methods for fabricating integrated circuits. During intermediate stages of the fabrication of an integrated circuit (IC), a resistive metal-containing layer that overlies a first dielectric material layer is patterned to form a patterned resistive metal-containing layer that defines a metal resistor. The first dielectric material layer overlies a semiconductor substrate that includes a device region with active areas, e.g., source and drain regions. A gate is disposed in the device region adjacent to the active areas. In an exemplary embodiment, the device region is configured as a fin-type FET transistor (e.g., FINFET) that comprises a fin that includes the active areas and the gate that overlies a portion of the fin adjacent to the active areas. An upper surface of the gate is disposed in a higher but parallel plane relative to a plane in which the surfaces of the active areas are disposed. The patterned resistive metal-containing layer is laterally adjacent to the device region and overlies the first dielectric material layer and the semiconductor substrate. In an exemplary embodiment, the patterned resistive metal-containing layer is disposed in a higher but parallel plane relative to the plane in which the surfaces of the active areas are disposed but is at a level proximate the plane in which the upper surface of the gate is disposed.

A second dielectric material layer is deposited overlying both the first dielectric material layer and the patterned resistive metal-containing layer. The first and second dielectric material layers are etched to form first contact vias that expose the surfaces of the active areas of the device region. The second dielectric material layer and optionally an upper portion of the first dielectric material layer are etched to form second contact vias that correspondingly expose the patterned resistive metal-containing layer and the upper surface of the gate. An electrically-conductive material is deposited in the first contact vias and the second contact vias to form first contacts that are in electrical communication with the active areas and second contacts that include a gate contact and a metal resistor contact. The gate contact is in electrical communication with the gate and the metal resistor contact is in electrical communication with the patterned resistive metal-containing layer. Because the patterned resistive metal-containing layer is disposed in a plane that is at a level proximate to the plane in which the upper surface of the gate is disposed, the gate contact and the metal resistor contact can be formed simultaneously including etching the dielectric materials and filling with the electrically-conductive material to efficiently form the electrical connections to FET transistor and the metal resistor while avoiding via punch-through of the metal resistor.

FIGS. 1-6 illustrate methods for fabricating an IC 10 in accordance with various embodiments. The described process steps, procedures, and materials are to be considered only as exemplary embodiments designed to illustrate to one of ordinary skill in the art methods for practicing the invention; the invention is not limited to these exemplary embodiments. Various steps in the manufacture of ICs are well known and so, in the interest of brevity, many conventional steps will only be mentioned briefly herein or will be omitted entirely without providing the well-known process details.

FIG. 1 illustrates, in cross-sectional view, a portion of the IC 10 during an intermediate fabrication stage in accordance with an exemplary embodiment. The IC 10 includes a semiconductor substrate 12 that includes a device region 14 and upon which layers of dielectric materials are formed as will be described in further detail below. Depending on the overall design strategy employed for the IC 10, the semiconductor substrate 12 may in some cases be a substantially crystalline substrate material (i.e. bulk silicon), whereas in other instances the semiconductor substrate 12 may be formed on the basis of a silicon-on-insulator (SOI) architecture as is well known in the art. It should be appreciated that the semiconductor substrate 12, even if including a substantially silicon-based material layer, may include other semiconducting materials, such as germanium, carbon, and the like, in addition to appropriate dopant species for establishing the requisite active area conductivity type for the circuit elements.

In an exemplary embodiment and as illustrated, the device region 14 includes fins 16 and 18 (shown in a cross-sectional longitudinal view) that are formed from the semiconductor substrate 12 using conventional patterning and etching techniques. Adjacent to the fins 16 and 18 is shallow trench isolation (STI) 20. The STI 20 is formed of oxide material that is deposited into the semiconductor substrate 12 for electrically isolating the fins 16 and 18 using well known techniques. Gates 22 (e.g., gate electrodes) that overlie portions of the device region 14 (e.g., fins 16 and 18) that define channels in the fins 16 and 18 and are electrically insulated from the fins 16 and 18 each by a gate insulator (not illustrated). Adjacent to the gates 22, areas of the fins 16 and 18 are appropriately impurity doped to form active areas 24 (e.g., source and drain regions). Upper surfaces 26 of the gates 22 are planar and disposed above the active areas 24. Each of the fins 16 and 18 together with the corresponding active areas 24 and the gates 22 form transistor devices that are configured as FINFETs 28 and 30. It is to be appreciated that although the transistor devices are illustrated as FINFETs 28 and 30, other embodiments may include transistor devices configured as other well known FET structures, such as, for example, FETs that include a gate stack electrode formed above a channel region and laterally adjacent to source and drain regions that are formed in a semiconductor substrate.

As illustrated, a nitride layer 32 is disposed on the upper surfaces 26 and sidewalls 34 of the gates 22 and is used during earlier fabrication stages for gate formation (e.g., formation of the gates 22) using a self-aligning process as is well known in the art. Alternative known processes for forming the gates 22 which may or may not include the nitride layer 32 may also be used. A dielectric material layer 36 overlies the semiconductor substrate 12 including the fins 16 and 18, the STI 20, and the nitride layer 32. In an exemplary embodiment, the dielectric material layer 36 is an oxide, such as, for example, a silicon oxide. Further, the dielectric material may be a low dielectric constant (low k) material or an ultra-low k material as are known in the art. The dielectric material layer 36 may be formed through conventional techniques such as chemical vapor deposition (CVD), spin coating, and the like.

A resistive metal-containing layer 38 overlies the dielectric material layer 36. The resistive metal-containing layer 38 is used to provide functionality to the IC 10 as a device itself, such as a metal resistor as will be discussed in further detail below. The dielectric material layer 36 insulates the resistive metal-containing layer 38 from direct physical contact with the FINFETs 28 and 30. In an exemplary embodiment, the resistive metal-containing layer 38 comprises titanium nitride, tungsten silicide, or combinations thereof. Alternatively, other resistive metals known to those skilled in the art may be used to form the resistive metal-containing layer 38. The resistive metal-containing layer 38 may be formed through conventional metal deposition techniques such as physical vapor deposition (PVD), CVD, sputtering, and the like.

Figure 2:
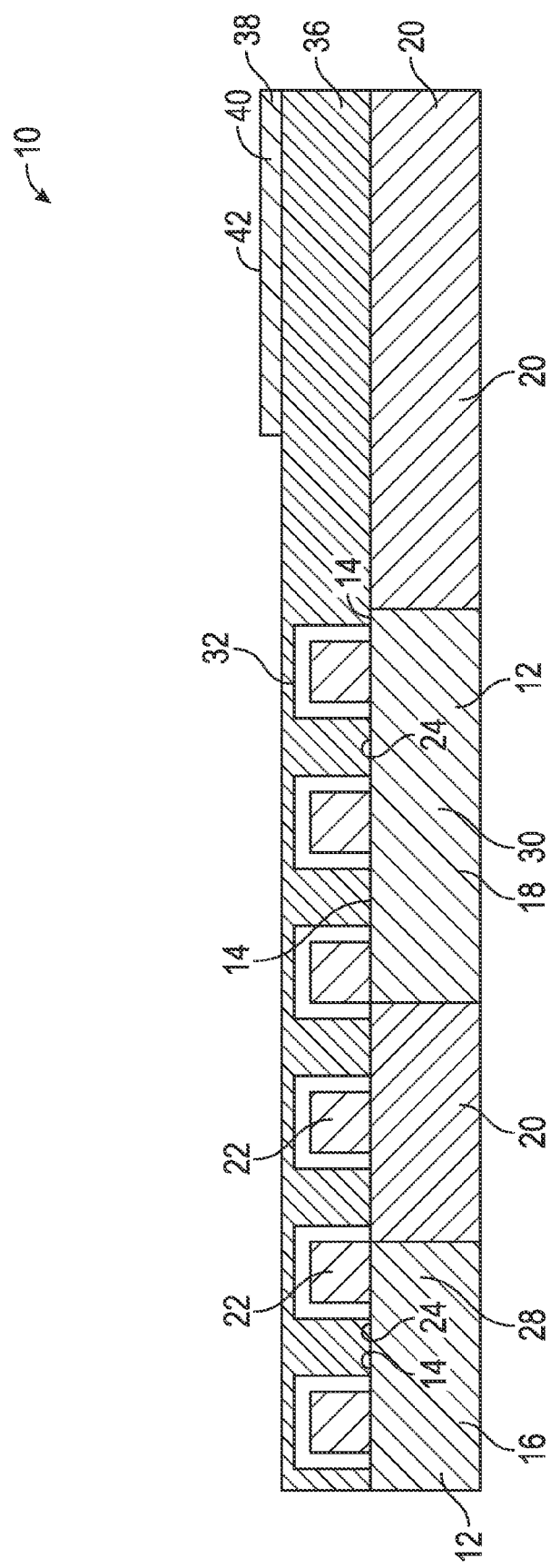

FIG. 2 illustrates, in cross-sectional view, the IC 10 during a further advanced fabrication stage in accordance with an exemplary embodiment. The resistive metal-containing layer 38 is patterned to form a patterned resistive metal-containing layer 40. In an exemplary embodiment, the patterned resistive metal-containing layer 40 provides functionality to the IC 10 as a metal resistor 42. The resistive metal-containing layer 38 may be patterned through conventional techniques, such as by patterning a mask (not shown) over the resistive metal-containing layer 38 followed by etching the resistive metal-containing layer 38 through the pattern in the mask. After patterning, the patterned resistive metal-containing layer 40 is disposed over the dielectric material layer 36 laterally adjacent to the device region 14. In an exemplary embodiment, the patterned resistive metal-containing layer 40 does not overlie the device region 14 so that the dielectric material layer 36 can be vertically etched directly down to the device region 14 without passing through the patterned resistive metal-containing layer 40 as will be discussed in further detail below.

Figure 3:
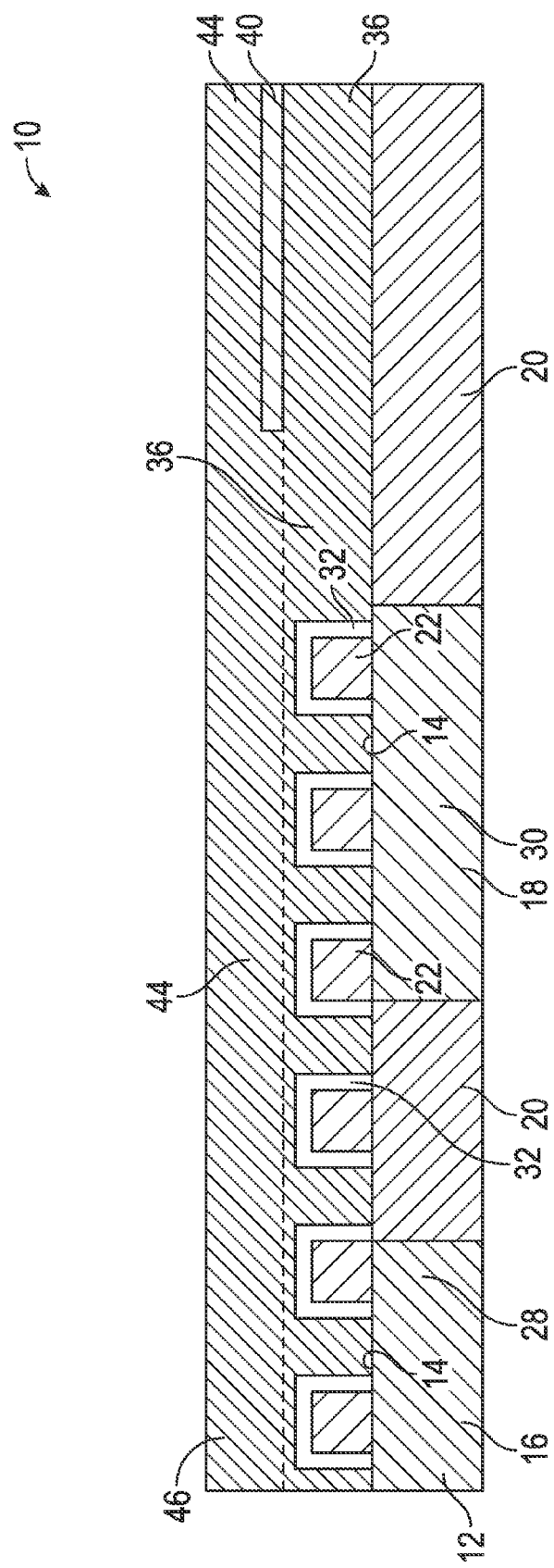

The process continues as illustrated in FIG. 3 by depositing a dielectric material layer 44 over the patterned resistive metal-containing layer 40 and regions of the dielectric material layer 36 that are free from the patterned resistive metal-containing layer 40, e.g., regions of the dielectric material layer 36 over the device region 14. The dielectric material layer 44 may be formed from the same or different dielectric material that is employed to form the dielectric material layer 36. In an exemplary embodiment, the dielectric material layers 36 and 44 are formed from the same nominal dielectric material to provide consistent etch characteristics between the dielectric material layer 36 and the dielectric material layer 44. Together, the dielectric material layers 36 and 44 form an interlayer dielectric (ILD) layer 46 of dielectric material that overlies the semiconductor substrate 12 including over the device region 14. As illustrated, the patterned resistive metal-containing layer 40 is embedded in the ILD layer 46 above and spaced apart from the semiconductor substrate 12. A chemical mechanical planarization (CMP) process may be used to planarize the upper portion of the ILD layer 46.

Figure 4:
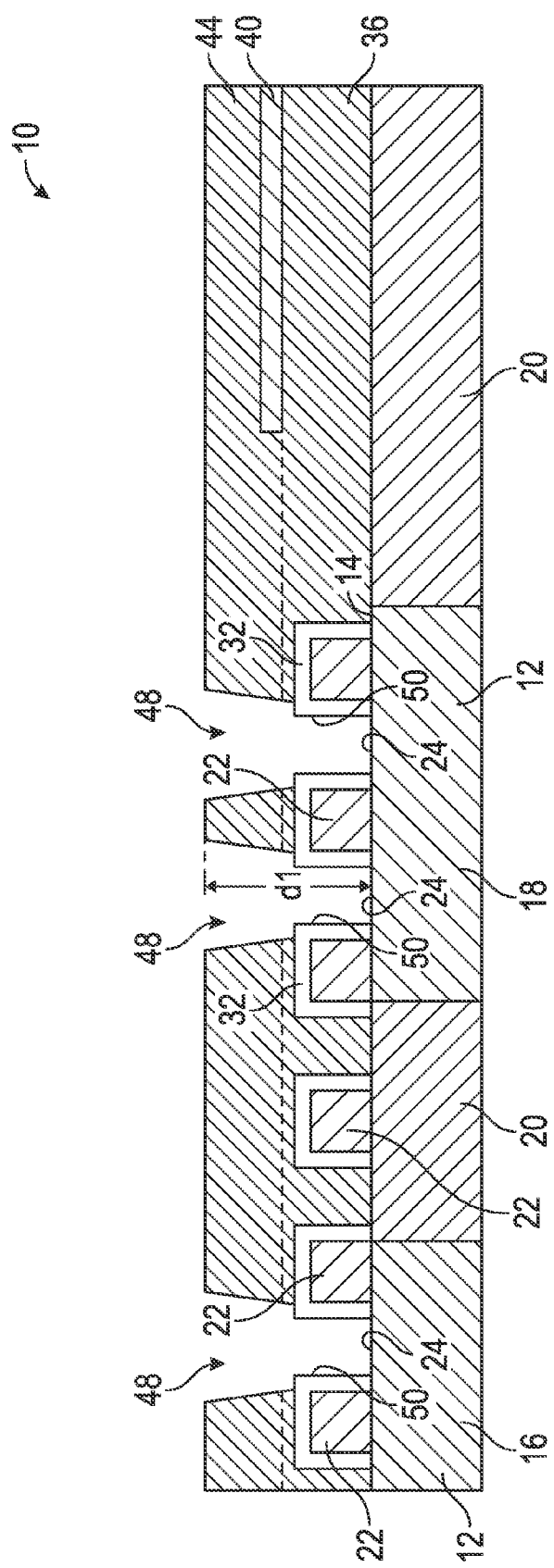

FIG. 4 illustrates, in cross-sectional view, the IC 10 during a further advanced fabrication stage in accordance with an exemplary embodiment. A region of the ILD layer 46 that overlies the device region 14 is etched to form contact vias 48 that expose the active areas 24 of the fins 16 and 18 of the device region 14. In an exemplary embodiment, the contact vias 48 are formed completely through the dielectric material layers 36 and 44 to expose the active areas 24 between gates 22 and the sidewalls 50 of the nitride layer 32. The ILD layer 46 may be etched using a wet etching process employing, for example, an oxide etchant such as, but not limited to, $CHF_3$, $CF_4$, or $SF_6$. Alternatively, a dry etching process such as, but not limited to, a plasma etching process, e.g., reactive ion etching (RIE), may be used to etch the ILD layer 46. In an exemplary embodiment, the contact vias 48 have a depth (indicated by double headed arrow d1) in the ILD layer 46 of from about 100 to about 150 nm.

Figure 5:
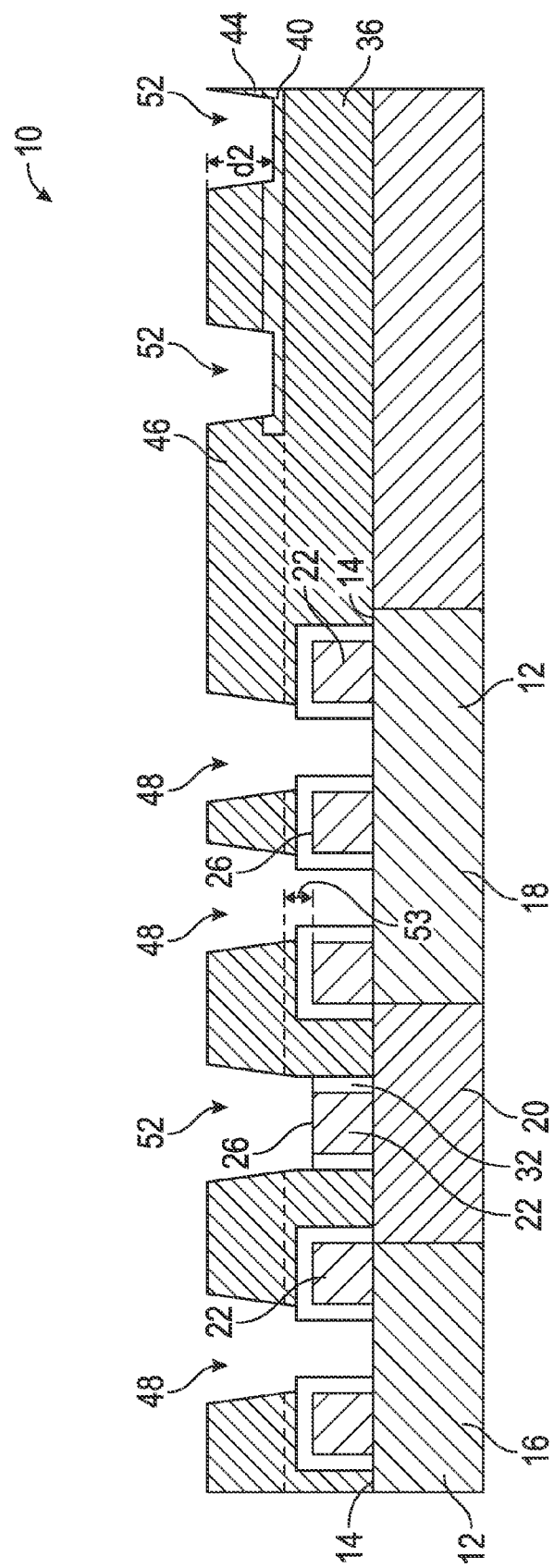

FIG. 5 illustrates, in cross-sectional view, the IC 10 during a further advanced fabrication stage in accordance with an exemplary embodiment. The regions of the ILD layer 46 that overlie the device region 14 and the patterned resistive metal-containing layer 40 are etched partially through to form contact vias 52. As illustrated, the region of the dielectric material layer 44 that overlies the patterned resistive metal-containing layer 40 is completely etched through to form the contact vias 52 that expose the patterned resistive metal-containing layer 40. In the region of the ILD layer 46 that overlies the device region 14, the dielectric material layer 44 and optionally an upper portion of the dielectric material layer 36 (e.g., depending upon the relative height or level difference between the upper surfaces 26 of the gates 22 and the patterned resistive metal-containing layer 40), and additionally the nitride layer 32 are etched to form the contacts via 52 that exposes the upper surface 26 of a corresponding gate 22. In an exemplary embodiment, the relative height or level difference between the upper surface 26 of the gates 22 and the patterned resistive metal-containing layer 40 indicated by double headed arrow 53 is relatively small and from about 0 to about 10 nm. Because the relative height or level difference between the patterned resistive metal-containing layer 40 and the upper surface 26 of the gate 22 is relatively small, the ILD layer 46 can be efficiently etched to simultaneously form the contact vias 52 while avoiding punch-through of the patterned resistive metal-containing layer 40. In an exemplary embodiment, the contact vias 52 have a depth (indicated by double headed arrow d2) in the ILD layer 46 of from about 50 to about 100 nm. In an exemplary embodiment, the contact vias 52 can be formed using a wet or dry etching process similar to the wet or dry etching process used to form the contact vias 48 as discussed above.

Figure 6:
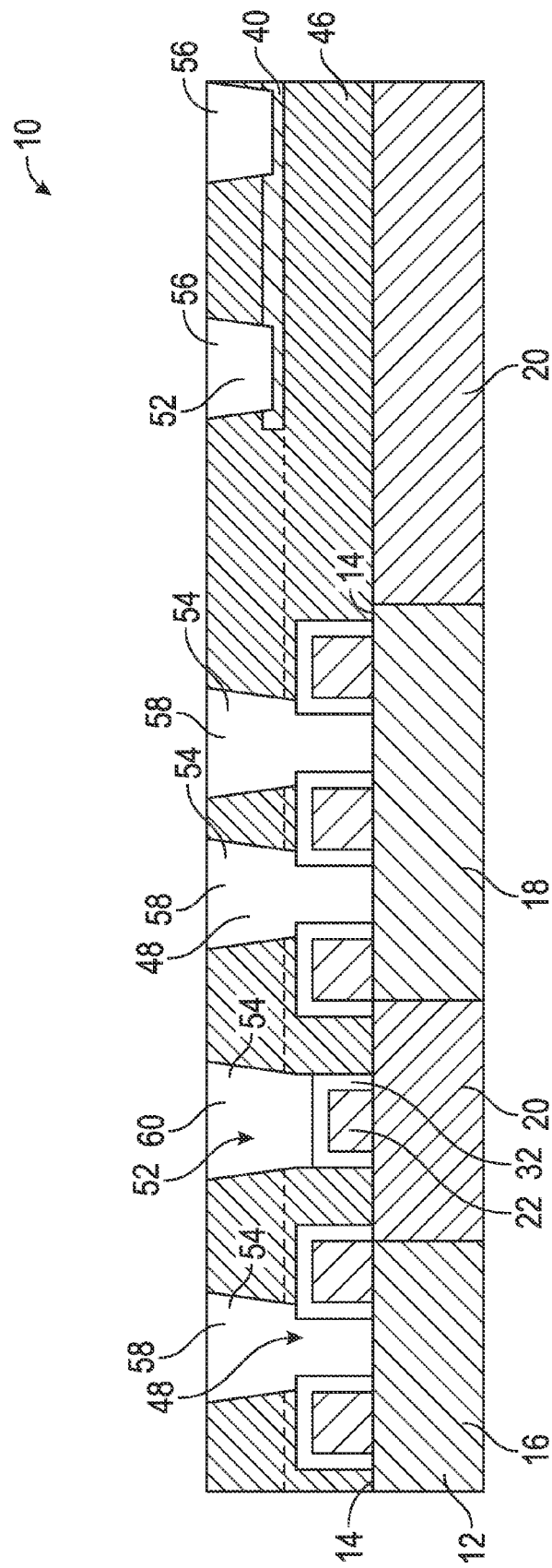

The process continues as illustrated in FIG. 6 by filling the contact vias 48 and 52 with an electrically-conductive material to form device contacts 54 and metal resistor contacts 56. In particular, the device contacts 54 include active area contacts 58 that are in electrical communication with the active areas 24 (e.g., source and drain regions) and a gate contact 60 that is in electrical communication with a corresponding gate 22. The metal resistor contacts 56 are in electrical communication with the patterned resistive metal-containing layer 40. In an exemplary embodiment the contact vias 48 and 52 are concurrently filled with the electrically-conductive material. Suitable electrically-conductive materials that may be employed to form the device and metal resistor contacts 54 and 56 include, but are not limited to, copper, tungsten, aluminum, silver, gold, other conductive metals, or alloys or combinations thereof. Excess electrically-conductive material outside the contact vias 48 and 52 may be removed through planarization using a CMP process after filling the contact vias 48 and 52 with the electrically-conductive material. After forming the device and metal resistor contacts 54 and 56, it is to be appreciated that further layers may be formed over the ILD layer 46, the device contacts 54, and the metal resistor contacts 56 in accordance with conventional integrated circuit fabrication.

Accordingly, integrated circuits with reliable electrical connections to metal resistors and methods for fabricating such integrated circuits have been described.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
etching an ILD layer of dielectric material overlying a semiconductor substrate that comprises a device region to form first contact vias that expose active areas of the device region;
etching the ILD layer to form second contact vias that correspondingly expose a gate that is disposed in the device region adjacent to the active areas and a patterned resistive metal-containing layer that is disposed in the ILD layer adjacent to the device region, wherein the patterned resistive metal-containing layer is spaced apart and separated from the gate by at least a portion of the dielectric material; and
filling the first contact vias and the second contact vias with an electrically-conductive material to form first contacts that are in electrical communication with the active areas and second contacts that include a gate contact and a metal resistor contact that are in electrical communication with the gate and the patterned resistive metal-containing layer, respectively, wherein, prior to filling, the active areas, the gate, and the patterned resistive metal-containing layer are concurrently exposed by the first and second contact vias, and wherein filling comprises filling the first and second contact vias with the electrically-conductive material to simultaneously cover exposed portions of the active areas, the gate, and the patterned resistive metal-containing layer.

2. The method of claim 1, wherein etching the ILD layer to form the first contact vias comprises etching completely through the ILD layer to form the first contact vias.

3. The method of claim 1, wherein etching the ILD layer to form the second contact vias comprises etching partially through the ILD layer to form the second contact vias.

4. The method of claim 1, wherein etching the ILD layer to form the first contact vias comprises forming the first contact vias having a depth in the ILD layer of from about 100 to about 150 nm.

5. The method of claim 1, wherein etching the ILD layer to form the second contact vias comprises forming the second contact vias having a depth in the ILD layer of from about 50 to about 100 nm.

6. The method of claim 1, wherein filling comprises concurrently filling the first contact vias and the second contact vias with the electrically-conductive material.

7. The method of claim 1, wherein the device region includes at least two gates including the gate as a first gate and independently a second gate, and wherein a nitride layer is disposed on each of the first and second gates, and wherein etching the ILD layer to form the first contact vias comprises forming one of the first contact vias disposed between the first and second gates and exposing sidewalls of the nitride layers.

8. The method of claim 1, wherein a nitride layer is disposed on the gate, and wherein etching the ILD layer to form the second contact vias comprises etching the ILD layer and through the nitride layer to form one of the second contact vias that exposes an upper portion of the gate.

9. The method of claim 1, wherein the device region is configured as a FINFET comprising a fin that includes the active areas, and wherein etching the ILD layer to form the first contact vias comprises forming the first contact vias exposing the fin.

10. A method for fabricating an integrated circuit comprising:
patterning a resistive metal-containing layer overlying a first dielectric material layer to form a patterned resistive metal-containing layer, wherein the first dielectric material layer overlies a semiconductor substrate that comprises a device region and the patterned resistive metal-containing layer is disposed laterally adjacent to the device region overlying the first dielectric material layer and the semiconductor substrate;
depositing a second dielectric material layer overlying the first dielectric material layer and the patterned resistive metal-containing layer;
etching the first and second dielectric material layers to form first contact vias that expose active areas of the device region;
etching the second dielectric material layer for forming second contact vias that correspondingly expose the patterned resistive metal-containing layer and a gate that is disposed in the device region adjacent to the active areas; and
depositing an electrically-conductive material in the first contact vias and the second contact vias to form first contacts that are in electrical communication with the active areas and second contacts that include a gate contact and a metal resistor contact that are in electrical communication with the gate and the patterned resistive metal-containing layer, respectively, wherein, prior to depositing the electrically-conductive material, the active areas, the gate, and the patterned resistive metal-containing layer are concurrently exposed by the first and second contact vias, and wherein depositing the electrically-conductive material comprises filling the first and second contact vias with the electrically-conductive material to simultaneously cover exposed portions of the active areas, the gate, and the patterned resistive metal-containing layer.

11. The method of claim 10, wherein etching the first and second dielectric material layers comprises etching completely through the first and second dielectric material layers to form the first contact vias.

12. The method of claim 10, wherein etching the second dielectric material layer comprises etching completely through the second dielectric material layer in the absence of etching through a lower portion and an intermediate portion of the first dielectric material layer to form the second contact vias.

13. The method of claim 10, further comprising the step of:
depositing a resistive metal-containing material overlying the first dielectric material layer to form the resistive metal-containing layer.

14. The method of claim 13, wherein depositing the resistive metal-containing material comprises depositing the resistive metal-containing material that comprises titanium nitride, tungsten silicide, or combinations thereof.

15. The method of claim 10, wherein patterning the resistive metal-containing layer comprises forming the patterned resistive metal-containing layer laterally spaced apart from portions of the first and second dielectric material layers that are disposed directly overlying the device region.

16. The method of claim 10, wherein etching the first and second dielectric material layers comprises etching the first and second dielectric material layers using a wet etching process.

17. The method of claim 10, wherein etching the first and second dielectric material layers comprises etching the first and second dielectric material layers using a dry etching process.

18. The method of claim 10, wherein etching the second dielectric material layer comprises etching the second dielectric material layer using a wet etching process.

19. The method of claim 10, wherein etching the second dielectric material layer comprises etching the second dielectric material layer using a dry etching process.

\* \* \* \* \*